US 8,907,402 B2

(12) United States Patent
Shinohara

(10) Patent No.: US 8,907,402 B2
(45) Date of Patent: Dec. 9, 2014

(54) METHOD FOR MANUFACTURING NONVOLATILE SEMICONDUCTOR MEMORY DEVICE AND NONVOLATILE SEMICONDUCTOR MEMORY DEVICE

(71) Applicant: Kabushiki Kaisha Toshiba, Minato-ku (JP)

(72) Inventor: Hiroshi Shinohara, Kanagawa-ken (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 13/927,768

(22) Filed: Jun. 26, 2013

(65) Prior Publication Data

US 2014/0061768 A1    Mar. 6, 2014

Related U.S. Application Data

(60) Provisional application No. 61/697,084, filed on Sep. 5, 2012.

(51) Int. Cl.
| H01L 27/105 | (2006.01) |
| H01L 29/792 | (2006.01) |
| H01L 27/115 | (2006.01) |
| H01L 29/66 | (2006.01) |

(52) U.S. Cl.
CPC ...... *H01L 29/66833* (2013.01); *H01L 27/1157* (2013.01); *H01L 29/7926* (2013.01); *H01L 27/11582* (2013.01); *H01L 29/792* (2013.01)
USPC .......................................... 257/326; 438/268

(58) Field of Classification Search
USPC ........... 257/314–326, E27.081; 438/268–269
See application file for complete search history.

(56) References Cited

U.S. PATENT DOCUMENTS

| 2009/0242966 A1* | 10/2009 | Son et al. ................ 257/324 |
| 2010/0118610 A1* | 5/2010 | Katsumata et al. ...... 365/185.18 |
| 2011/0115014 A1* | 5/2011 | Ichinose et al. ............ 257/324 |
| 2012/0068253 A1 | 3/2012 | Oota et al. |

FOREIGN PATENT DOCUMENTS

| JP | 2011-151113 | 8/2011 |
| JP | 2011-249803 | 12/2011 |

* cited by examiner

*Primary Examiner* — Julio J Maldonado
*Assistant Examiner* — Daniel Shook
(74) *Attorney, Agent, or Firm* — Oblon, Spivak, McClelland, Maier & Neustadt, L.L.P.

(57) ABSTRACT

According to one embodiment, a method for manufacturing is a method for manufacturing a nonvolatile semiconductor memory device including a memory string having series-connected memory cells. The method includes forming a first semiconductor layer; forming a first sacrificial layer and the bottom surface and the side surface being surrounded with the first semiconductor layer; forming a first insulating layer on the first semiconductor layer and the first sacrificial layer; forming a stacked body on the first insulating layer, the body including electrode layers and second sacrificial layers alternately stacked; forming a first trench extending from an upper surface of the body to the first insulating layer on the first sacrificial layer; forming a second insulating layer in the first trench; forming a second trench extending from the upper surface of the body to the first semiconductor layer; and forming a third insulating layer in the second trench.

20 Claims, 12 Drawing Sheets

METHOD FOR MANUFACTURING NONVOLATILE SEMICONDUCTOR MEMORY DEVICE AND NONVOLATILE SEMICONDUCTOR MEMORY DEVICE

CROSS-REFERENCE TO RELATED APPLICATIONS

This application is based upon and claims the benefit of priority from U.S. Provisional Patent Application 61/697,084, filed on Sep. 5, 2012; the entire contents of which are incorporated herein by reference.

FIELD

Embodiments described herein relate generally to a method for manufacturing a nonvolatile semiconductor memory device and a nonvolatile semiconductor memory device.

BACKGROUND

Recently, in the field of memory devices, three-dimensional memory cells have been drawing attention. To form such memory cells, a plurality of electrode layers functioning as control gates are stacked to form a stacked body. Memory holes are formed in the stacked body. A memory film is formed on the sidewall of the memory hole. A channel body layer is further formed in the memory hole. In this type of memory device, it is desired to further increase the number of the plurality of electrode layers in order to increase the degree of integration.

However, with the increase in the number of the plurality of electrode layers, the thickness of the stacked body increases. Thus, processing of the stacked body may cause trouble. For instance, if a deep trench is formed in the stacked body, the aspect ratio of the stacked body divided by the trench is inevitably increased. This decreases the mechanical strength of the divided stacked body, and may cause collapse of the divided stacked body.

DETAILED DESCRIPTION

Figure 1:
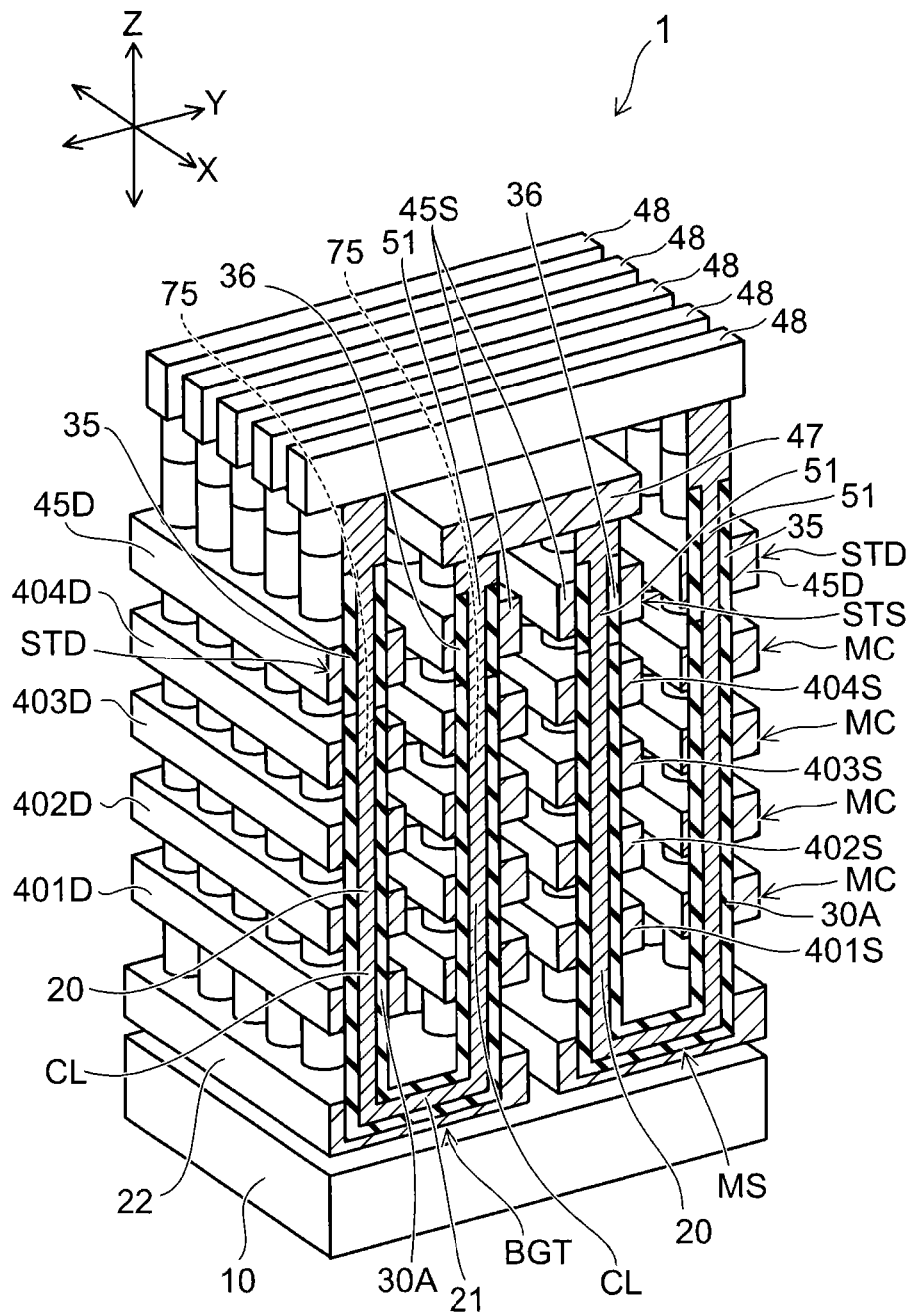
FIG. 1 is a schematic perspective view of a memory cell array section of a nonvolatile semiconductor memory device according to this embodiment.

In general, according to one embodiment, a method for manufacturing a nonvolatile semiconductor memory device is a method for manufacturing a nonvolatile semiconductor memory device including a memory string having series-connected memory cells. The method includes forming a first semiconductor layer on a foundation layer; forming a first sacrificial layer having a bottom surface and a side surface, and the bottom surface and the side surface being surrounded with the first semiconductor layer; forming a first insulating layer on the first semiconductor layer and on the first sacrificial layer; forming a stacked body on the first insulating layer, the stacked body including a plurality of electrode layers and a plurality of second sacrificial layers alternately stacked; forming a first trench extending from an upper surface of the stacked body to the first insulating layer on the first sacrificial layer; forming a second insulating layer in the first trench; forming a second trench extending from the upper surface of the stacked body to the first insulating layer; and forming a third insulating layer in the second trench.

Embodiments will now be described with reference to the drawings. In the following description, like members are labeled with like reference numerals. The description of the members once described is omitted appropriately.

Before describing a method for manufacturing a nonvolatile semiconductor memory device according to this embodiment, an overview of memory cells is described.

FIG. 1 is a schematic perspective view of a memory cell array section of the nonvolatile semiconductor memory device according to this embodiment.

Figure 2:
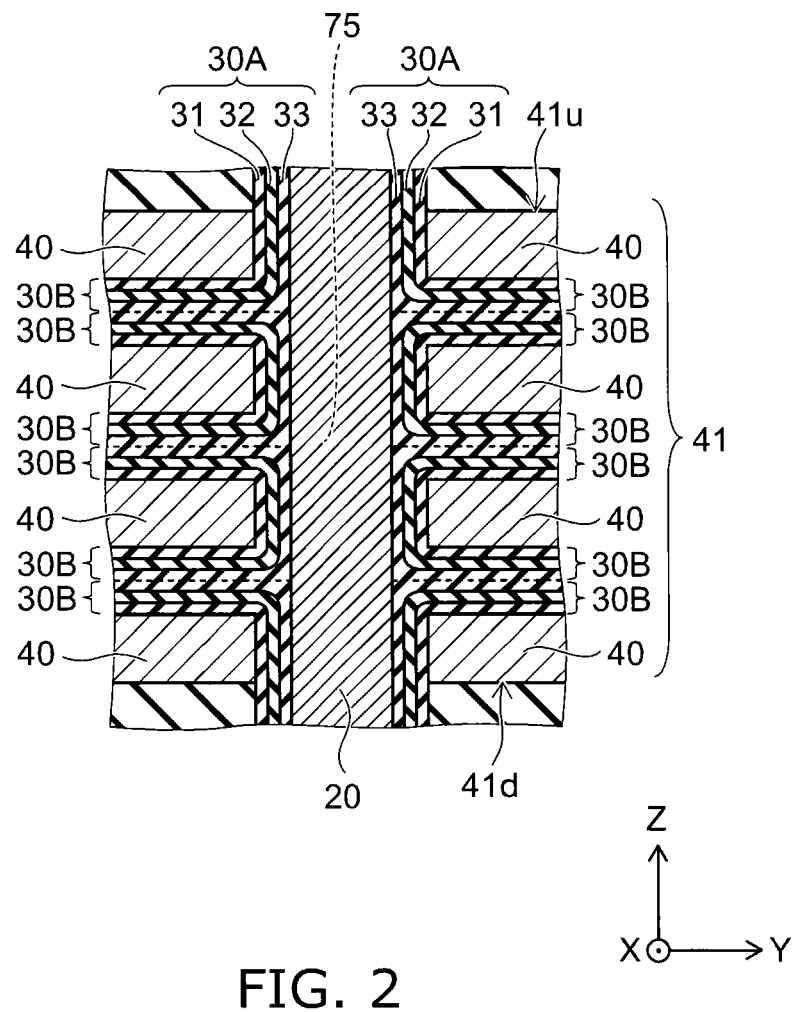
FIG. 2 is an enlarged schematic sectional view of the memory cell section according to this embodiment.

FIG. 2 is an enlarged schematic sectional view of the memory cell section according to this embodiment.

In FIG. 1, for clarity of illustration, insulating portions other than the insulating film formed on the inner wall of the memory hole 75 are not shown.

In FIG. 1, for convenience of description, an XYZ orthogonal coordinate system is introduced. In this coordinate system, two directions parallel to the major surface of the substrate 10 and orthogonal to each other are referred to as X direction and Y direction. The direction orthogonal to both these X and Y directions is referred to as Z direction.

The nonvolatile semiconductor memory device 1 includes memory strings in which memory cells are series connected. In the nonvolatile semiconductor memory device 1, on a substrate 10, a semiconductor layer 22 (back gate layer, or first semiconductor layer) is provided via an insulating layer, not shown.

The substrate 10 and this insulating layer are collectively referred to as foundation layer. In the substrate 10, active elements such as transistors, and passive elements such as resistors and capacitors are provided. The semiconductor layer 22 is e.g. a silicon (Si) layer doped with an impurity element.

On the semiconductor layer 22, a plurality of insulating layers 30B (see FIG. 2), electrode layers 401D, 402D, 403D, 404D on the drain side, and electrode layers 401S, 402S, 403S, 404S on the source side are alternately stacked.

The electrode layer 401D and the electrode layer 401S are provided at the same level and represent first lowest electrode layers. The electrode layer 402D and the electrode layer 402S are provided at the same level and represent second lowest electrode layers.

The electrode layer 403D and the electrode layer 403S are provided at the same level and represent third lowest electrode layers. The electrode layer 404D and the electrode layer 404S are provided at the same level and represent fourth lowest electrode layers.

The electrode layer 401D and the electrode layer 401S are divided in the Y direction. The electrode layer 402D and the electrode layer 402S are divided in the Y direction. The electrode layer 403D and the electrode layer 403S are divided in the Y direction. The electrode layer 404D and the electrode layer 404S are divided in the Y direction.

An insulating layer, not shown, is provided between the electrode layer 401D and the electrode layer 401S, between the electrode layer 402D and the electrode layer 402S, between the electrode layer 403D and the electrode layer 403S, and between the electrode layer 404D and the electrode layer 404S.

The electrode layers 401D, 402D, 403D, 404D are provided between the semiconductor layer 22 and a drain side select gate electrode 45D. The electrode layers 401S, 402S, 403S, 404S are provided between the semiconductor layer 22 and a source side select gate electrode 45S.

In the following description, the electrode layers 401D, 402D, 403D, 404D, 401S, 402S, 403S, 404S may also be collectively and simply referred to as electrode layers 40. The number of electrode layers 40 is arbitrary, and not limited to four layers illustrated in this embodiment.

The electrode layer 40 is e.g. a silicon layer doped with an impurity element such as boron (B) and having conductivity. In this embodiment, as the insulating layer 30B, an insulating layer of an ONO structure is illustrated (described later).

On the electrode layer 404D, a drain side select gate electrode 45D is provided via an insulating layer, not shown. The drain side select gate electrode 45D is e.g. a silicon layer doped with impurity and having conductivity.

On the electrode layer 404S, a source side select gate electrode 45S is provided via an insulating layer, not shown. The source side select gate electrode 45S is e.g. a silicon layer doped with impurity and having conductivity.

The drain side select gate electrode 45D and the source side select gate electrode 45S are divided in the Y direction. The drain side select gate electrode 45D and the source side select gate electrode 45S may also be simply referred to as select gate electrode 45 without distinction.

On the source side select gate electrode 45S, a source line 47 is provided via an insulating layer, not shown. The source line 47 is connected to a channel body layer 51 connected to one of a pair of channel body layers 20. The source line 47 is a metal layer, or a silicon layer doped with impurity and having conductivity.

On the drain side select gate electrode 45D and the source line 47, a plurality of bit lines 48 are provided via an insulating layer, not shown. The bit line 48 is connected to a channel body layer 51 connected to the other of the pair of channel body layers 20. The bit line 48 extends in the Y direction.

In the semiconductor layer 22 and the stacked body 41 on this semiconductor layer 22, a plurality of U-shaped memory holes 75 are formed. For instance, in the electrode layers 401D-404D and the drain side select gate electrode 45D, holes extending therethrough in the Z direction are formed. In the electrode layers 401S-404S and the source side select gate electrode 45S, holes extending therethrough in the Z direction are formed. A pair of the holes extending in the Z direction are linked via a recess (space portion) formed in the semiconductor layer 22 to constitute a U-shaped memory hole 75. Besides the U-shaped memory hole, this embodiment also includes a straight memory hole (described later).

Inside the memory hole 75, a channel body layer 20 (first channel body layer) is provided in a U-shape. The channel body layer 20 is e.g. a silicon layer. A memory film 30A is provided between the channel body layer 20 and the inner wall of the memory hole 75.

A gate insulating film 35 is provided between the channel body layer 51 (second channel body layer) connected to the channel body layer 20 and the drain side select gate electrode 45D. The channel body layer 51 is e.g. a silicon layer. A gate insulating film 36 is provided between the channel body layer 51 and the source side select gate electrode 45S.

Here, the embodiment is not limited to the structure in which the inside of the memory hole 75 is entirely filled with the channel body layer 20. As an alternative structure, the channel body layer 20 may be formed so as to leave a void portion on the central axis side of the memory hole 75, and the inside void portion may be filled with insulator.

The memory film 30A has e.g. an ONO (oxide-nitride-oxide) structure in which a silicon nitride film is sandwiched between a pair of silicon oxide films. As shown in FIG. 2, between the electrode layer 40 and the channel body layer 20, sequentially from the electrode layer 40 side, an insulating film 31, a charge accumulation film 32, and an insulating film 33 are provided. The insulating film 31 is in contact with the electrode layer 40. The insulating film 33 is in contact with the channel body layer 20. The charge accumulation film 32 is provided between the insulating film 31 and the insulating film 33. Here, between the electrode layers 40, two insulating layers 30B are provided. The insulating film 31 is e.g. a silicon oxide film. The charge accumulation film 32 is e.g. a silicon nitride film. The insulating film 33 is e.g. a silicon oxide film.

The channel body layer 20 functions as a channel in a transistor constituting a memory cell. The electrode layer 40 functions as a control gate. The charge accumulation film 32 functions as a data memory layer for accumulating charge injected from the channel body layer 20. That is, at the intersection of the channel body layer 20 and the electrode layer 40, a memory cell MC having a structure with the channel surrounded with the control gate is formed.

The nonvolatile semiconductor memory device 1 of this embodiment is a nonvolatile semiconductor memory device capable of electrically and freely erasing/writing data and retaining its memory content even when powered off.

The drain side select gate electrode 45D, the channel body layer 20, and the gate insulating film 35 therebetween constitute a drain side select transistor STD. The channel body layer 20 above the drain side select transistor STD is connected to a bit line 48.

The source side select gate electrode 45S, the channel body layer 51, and the gate insulating film 36 therebetween constitute a source side select transistor STS. The channel body layer 51 above the source side select transistor STS is connected to a source line 47.

The semiconductor layer 22, the channel body layer 20 provided in this semiconductor layer 22, and the memory film 30A constitute a semiconductor layer transistor BGT.

Between the drain side select transistor STD and the semiconductor layer transistor BGT, a plurality of memory cells MC with the electrode layers 404D-401D serving as control gates are provided. Similarly, also between the semiconductor layer transistor BGT and the source side select transistor STS, a plurality of memory cells MC with the electrode layers 401S-404S serving as control gates are provided.

The plurality of memory cells MC, the drain side select transistor STD, the semiconductor layer transistor BGT, and the source side select transistor STS are series connected via the channel body layer to constitute one U-shaped memory string MS.

One memory string MS includes a pair of columnar portions CL extending in the stacking direction of the stacked body 41 including a plurality of electrode layers 40, and a linking portion 21 embedded in the semiconductor layer 22 and linking the pair of columnar portions CL. A plurality of such memory strings MS are arranged in the X direction and the Y direction. Thus, a plurality of memory cells are provided three-dimensionally in the X direction, the Y direction, and the Z direction.

The plurality of memory strings MS are provided on a memory cell array region in the substrate 10. Around the periphery, for instance, of the memory cell array region in the substrate 10, a peripheral circuit for controlling the memory cell array is provided.

A method for manufacturing a nonvolatile semiconductor memory device according to this embodiment is now described.

FIGS. 3A to 8 are schematic sectional views describing the method for manufacturing a nonvolatile semiconductor memory device according to this embodiment. In FIGS. 6A to 7C, the foundation layer is not shown.

Figure 3A:
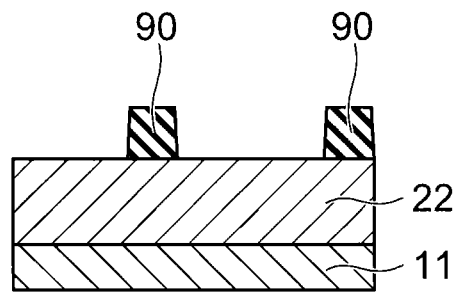
FIGS. 3A to 3D are schematic sectional views describing a method for manufacturing the nonvolatile semiconductor memory device according to this embodiment.
Figure 3A:
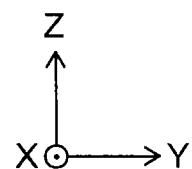

First, as shown in FIG. 3A, on a foundation layer 11, a semiconductor layer 22 is formed. In the foundation layer 11, transistors and the like in a peripheral circuit section for controlling memory cells are provided. The semiconductor layer 22 includes boron-doped silicon. Then, a mask layer 90 is patterned on the semiconductor layer 22. The mask layer 90 is a resist layer. Then, dry etching processing is performed on the surface of the semiconductor layer 22 exposed from the mask layer 90. This state is shown in FIG. 3B.

Figure 3B:
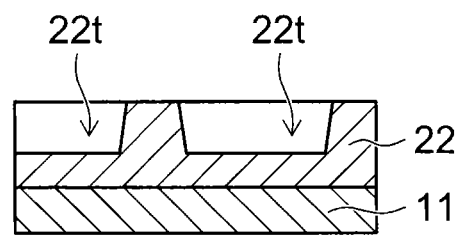
Figure 3B:
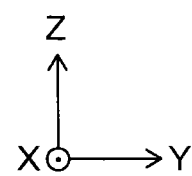

As shown in FIG. 3B, a recess 22t is formed in the semiconductor layer 22. Through this recess 22t, lower ends of a pair of memory holes will be linked (described later). Here, the mask layer 90 is removed.

Figure 3C:
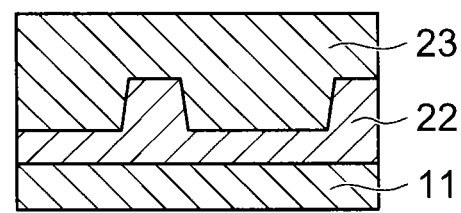
Figure 3C:
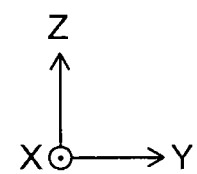

Next, as shown in FIG. 3C, a sacrificial layer 23 (first sacrificial layer) is formed on the semiconductor layer 22. The sacrificial layer 23 includes non-doped silicon.

Figure 3D:
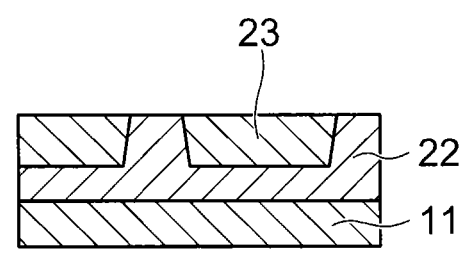
Figure 3D:
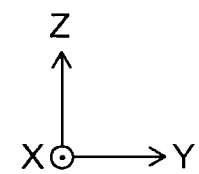

Next, as shown in FIG. 3D, the surface of the sacrificial layer 23 is etched back until the surface of the semiconductor layer 22 is exposed. The surface of the sacrificial layer 23 is made flush with the surface of the semiconductor layer 22. Thus, a sacrificial layer 23 with the bottom surface and the side surface surrounded with the semiconductor layer 22 is formed.

Figure 4A:
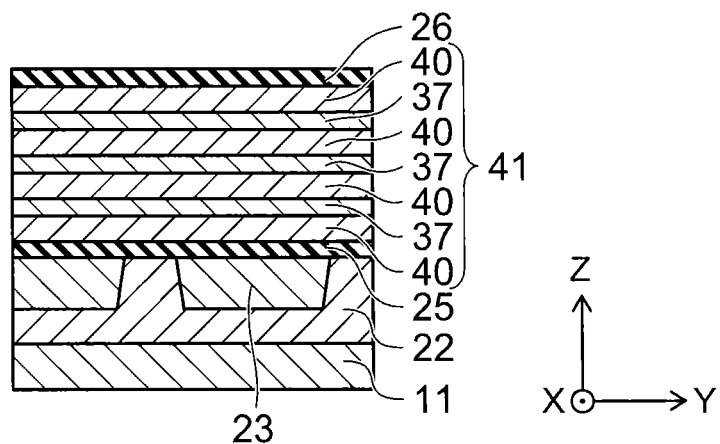
FIGS. 4A to 4C are schematic sectional views describing the method for manufacturing the nonvolatile semiconductor memory device according to this embodiment.

Next, as shown in FIG. 4A, an insulating layer 25 (first insulating layer) is formed on the semiconductor layer 22 and on the sacrificial layer 23. Then, on the insulating layer 25, a stacked body 41 with a plurality of electrode layers 40 and a plurality of sacrificial layers 37 (second sacrificial layers) alternately stacked therein is formed. Then, an insulating layer 26 is formed on the stacked body 41.

The thickness of the insulating layer 25 is set to a film thickness enough to maintain the breakdown voltage between the lowermost electrode layer 40 and the semiconductor layer 22. The electrode layer 40 includes boron-doped silicon. The sacrificial layer 37 includes non-doped silicon.

Figure 4B:
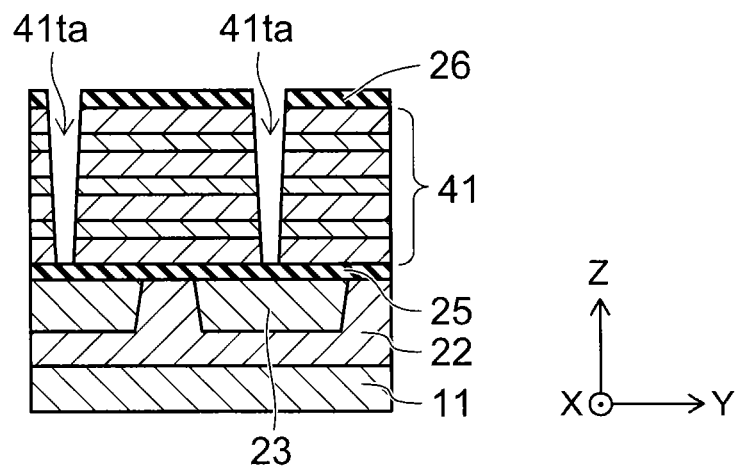

Next, as shown in FIG. 4B, a first trench 41ta (first trench) extending from the upper surface 41u of the stacked body 41 to the insulating layer 25 on the sacrificial layer 23 is formed. The trench 41ta is formed by photolithography and etching. The trench 41ta divides the stacked body 41 in the Y direction (see FIG. 1).

Figure 4C:
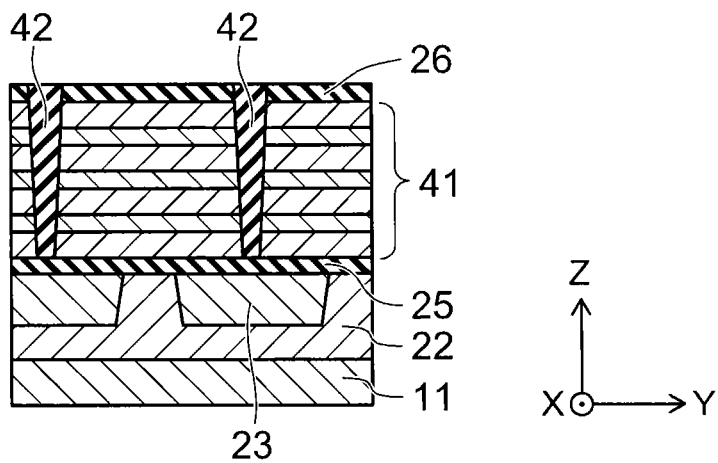

Next, as shown in FIG. 4C, an insulating layer 42 (second insulating layer) is formed in the trench 41ta. The insulating layer 42 includes silicon nitride.

Figure 5A:
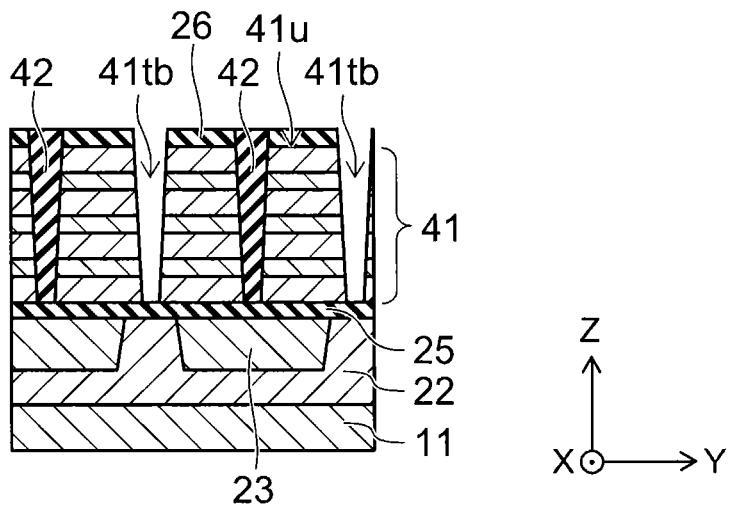
FIGS. 5A to 5C are schematic sectional views describing the method for manufacturing the nonvolatile semiconductor memory device according to this embodiment.

Next, as shown in FIG. 5A, a second trench 41tb (second trench) extending from the upper surface 41u of the stacked body 41 to the semiconductor layer 22 is formed. The trench 41tb is formed by photolithography and etching. The trench 41tb further divides the stacked body 41 in the Y direction.

Figure 5B:
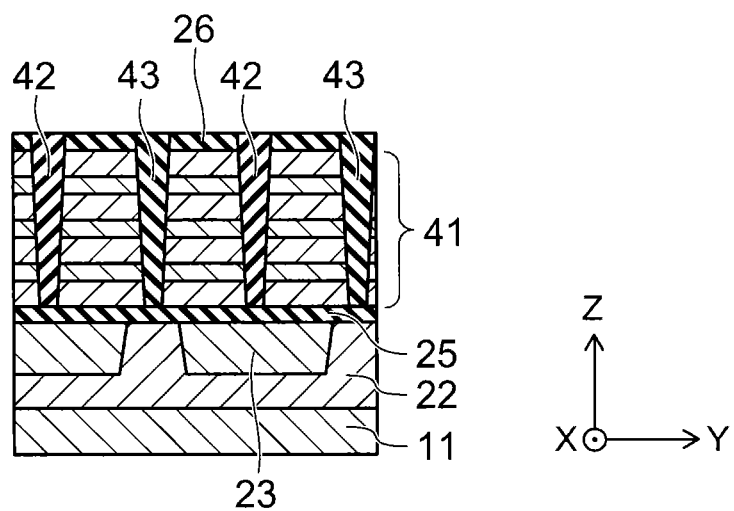

Next, as shown in FIG. 5B, an insulating layer 43 (third insulating layer) is formed in the trench 41tb. The insulating layer 43 includes silicon oxide. That is, the material of the insulating layer 42 and the material of the insulating layer 43 are different.

Figure 5C:
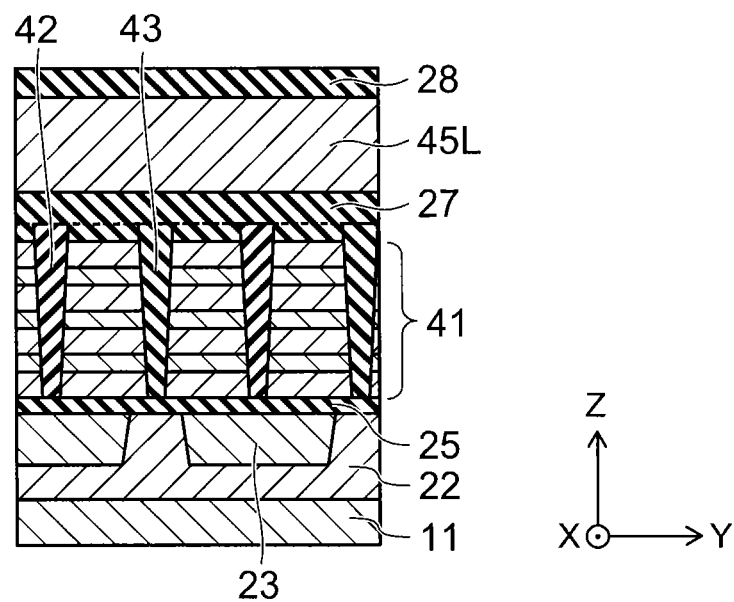

Next, as shown in FIG. 5C, an insulating layer 27 (fourth insulating layer) is formed on the stacked body 41, the insulating layer 42, and the insulating layer 43. Then, a select gate electrode layer 45L is formed on the insulating layer 27. Then, an insulating layer 28 (fifth insulating layer) is formed on the select gate electrode layer 45L.

Figure 6A:
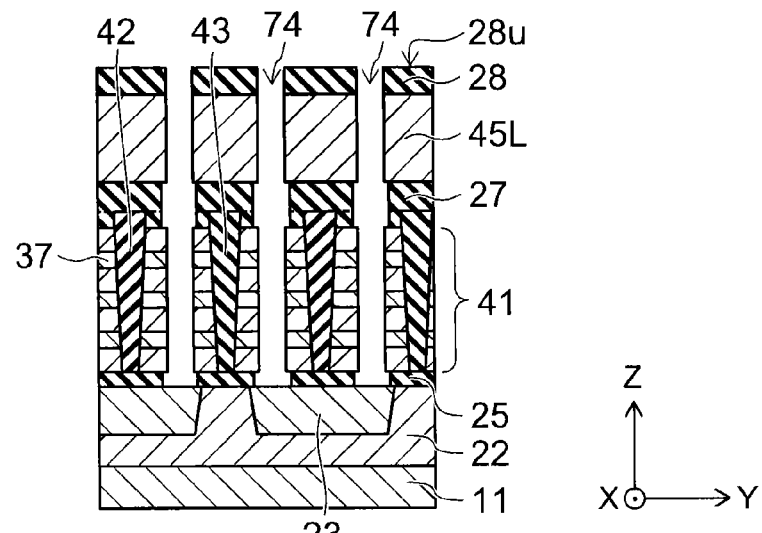
FIGS. 6A to 6C are schematic sectional views describing the method for manufacturing the nonvolatile semiconductor memory device according to this embodiment.

Next, as shown in FIG. 6A, a pair of holes 74 extending from the upper surface 28u of the insulating layer 28 to the sacrificial layer 23 are formed. Each of the pair of holes 74 extends on both sides of the insulating layer 42. The pair of holes 74 are formed by photolithography and etching.

Preferably, the hole 74 is processed so that the upper end diameter and the lower end diameter are generally equal. This is for the purpose of providing a plurality of transistors formed in the hole 74 with equal performance. The stacked body 41 is a stacked body of boron-doped silicon layers and non-doped silicon layers, and is composed primarily of silicon. Thus, the stacked body 41 can be regarded as a silicon monolayer. Accordingly, a hole 74 having a taper angle of generally 90° is formed by photolithography and etching.

Figure 6B:
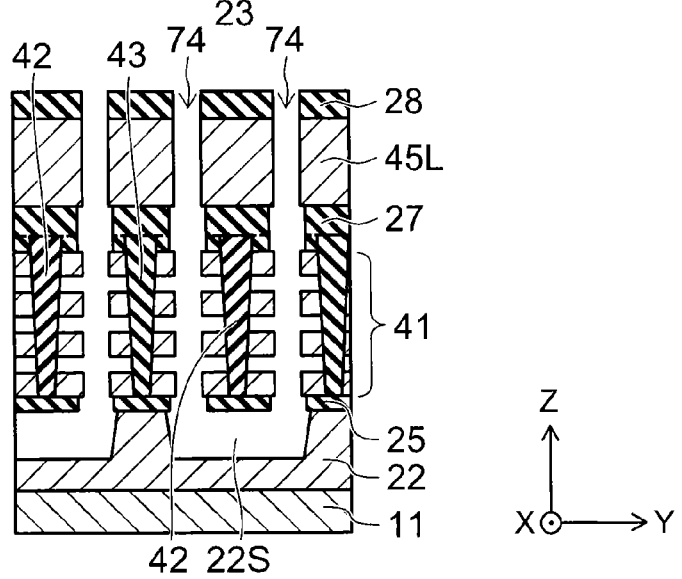

Next, as shown in FIG. 6B, the sacrificial layer 23 is removed through the pair of holes 74. Thus, a space portion 22s is formed in the semiconductor layer 22. The space portion 22s links the lower ends of the pair of holes 74. Furthermore, the plurality of sacrificial layers 37 are removed through the pair of holes 74. Thus, a space is formed between the plurality of electrode layers 40.

The removal of the sacrificial layers 23, 37 is performed by dissolving the sacrificial layers 23, 37 with alkaline chemicals.

When the sacrificial layers 37 are removed, the insulating layer 42 has been provided between the pair of holes 74, and the insulating layer 43 has been provided on both sides of the pair of holes 74. Thus, the pair of holes 74 are not connected via the space formed between the plurality of electrode layers 40. The insulating layers 42, 43 function as struts when removing the sacrificial layers 37.

Figure 6C:
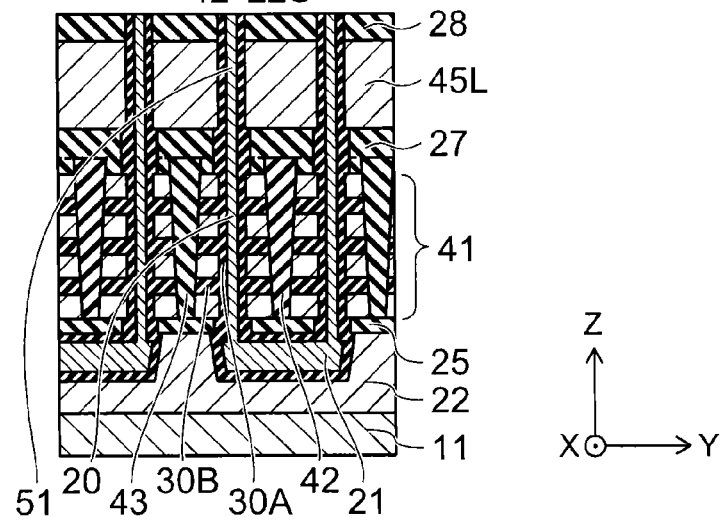

Next, as shown in FIG. 6C, a layer including a charge accumulation film 32 (the aforementioned memory film 30A) is formed on the sidewall of each of the pair of holes 74 and the inner wall of the space portion 22s. Sequentially, a channel body layer (channel body layer 20 and channel body layer 51) are formed on the sidewall of each of the pair of holes 74 and the inner wall of the space portion 22s. In the space portion 22s, a linking portion 21 linking the lower ends of a pair of channel body layers 20 is formed. The material of the linking portion 21 is the same as the material of the channel body layer 20. The layer including the charge accumulation film 32 is formed also between the plurality of electrode layers 40. The layer formed between the plurality of electrode layers 40 is the aforementioned insulating layer 30B.

Figure 7A:
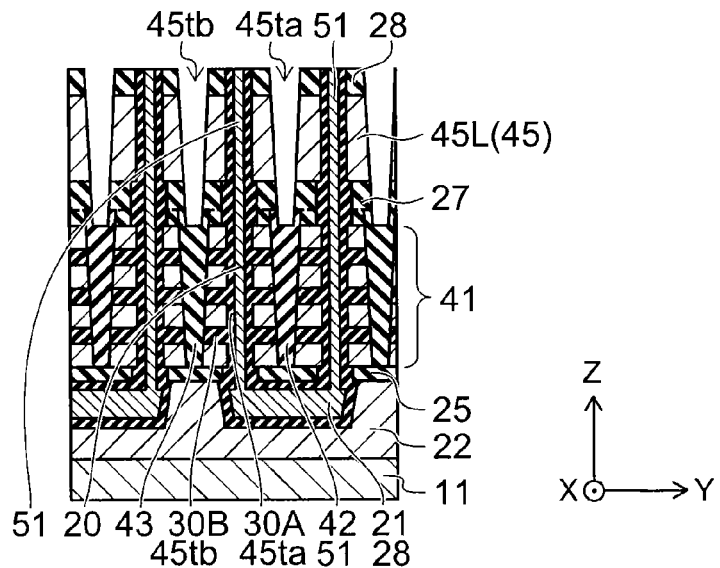
FIGS. 7A to 7C are schematic sectional views describing the method for manufacturing the nonvolatile semiconductor memory device according to this embodiment.

Next, as shown in FIG. 7A, a trench 45ta (third trench) extending from the upper surface of the insulating layer 28 through the select gate electrode layer 45L to the insulating layer 42 is formed. The trench 45ta divides the select gate electrode layer 45L in the arranging direction (Y direction) of the pair of holes 74. Furthermore, a trench 45tb (fourth trench) extending from the upper surface of the insulating layer 28 through the select gate electrode layer 45L to the insulating layer 43 is formed. The trench 45tb further divides the select gate electrode layer 45L in the arranging direction of the pair of holes 74. At this stage, the select gate electrode layer 45L is divided by the trenches 45ta, 45tb into select gate electrodes 45. The trenches 45ta, 45tb are formed by photolithography and etching.

Then, the insulating layer 42 is removed through the trench 45ta. For instance, the insulating layer 42 including silicon nitride is dissolved with hot phosphoric acid. Thus, the insulating layer 42 is removed. This state is shown in FIG. 7B.

Figure 7B:
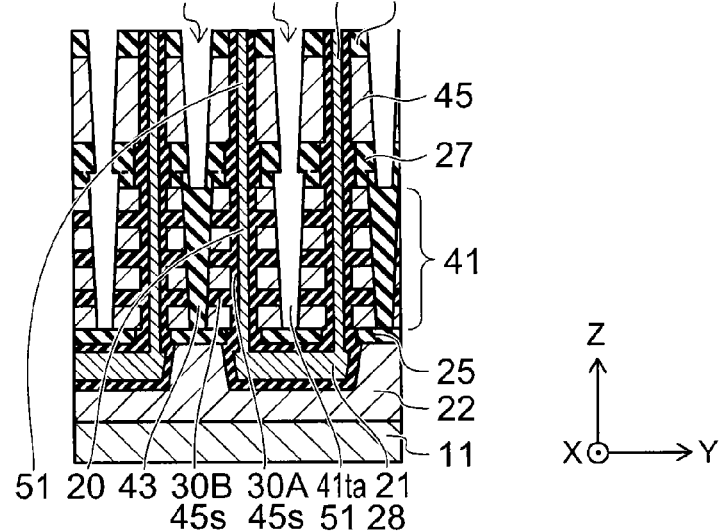

As shown in FIG. 7B, by the removal of the insulating layer 42, a trench 41ta linked to the trench 45ta is formed below the trench 45ta.

Figure 7C:
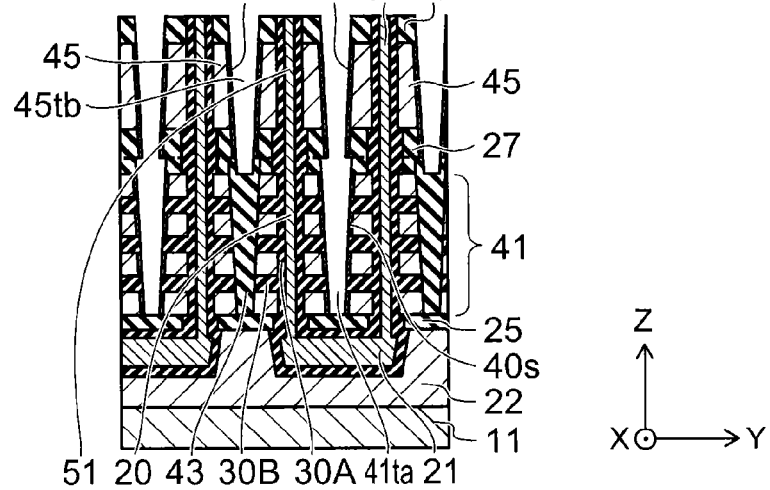

Next, as shown in FIG. 7C, part of each of the plurality of electrode layers 40 in the stacked body 40 divided by the trench 41ta is silicidized. Furthermore, part of the select gate electrode layer 45L divided by the trench 45ta and the trench 45tb is silicidized. That is, a silicide layer 40s is formed on the side surface of each of the plurality of electrode layers 40 divided by the trench 41ta. Furthermore, a silicide layer 45s is formed on the side surface of the select gate electrode 45.

For instance, on the inner wall of the trench 45tb, the trench 45ta, and the trench 41ta, a nickel film is formed and subjected to heat treatment. Thus, silicon reacts with nickel and forms a silicide layer 40s on the side surface of each of the plurality of electrode layers 40 divided by the trench 41ta. Furthermore, a silicide layer 45s is formed on the side surface of the select gate electrode 45. The unreacted nickel film is removed by wet etching. Here, no silicide layer is formed between the insulating layer 43 and the electrode layer 40.

Then, an insulating layer 53 (sixth insulating layer) is formed in the trench 41ta. An insulating layer 54 (seventh insulating layer) is formed in the trench 45ta. An insulating layer 55 (eighth insulating layer) is formed in the trench 45tb. This state is shown in FIG. 8.

Figure 8:
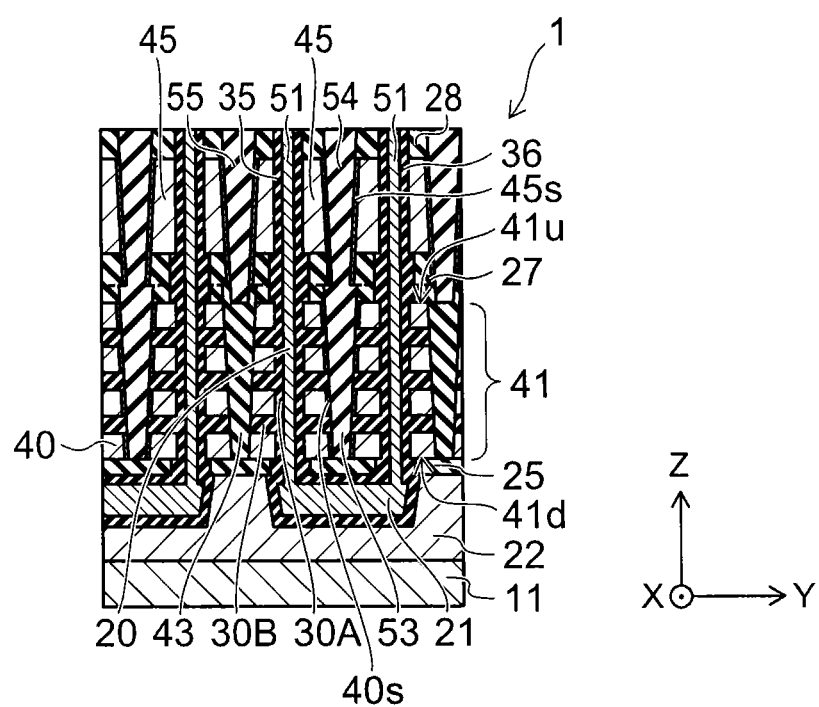
FIG. 8 is a schematic sectional view describing the method for manufacturing the nonvolatile semiconductor memory device according to this embodiment.

In the nonvolatile semiconductor memory device 1 shown in FIG. 8, a stacked body 41 with a plurality of electrode layers 40 and a plurality of intermediate layers (e.g., insulating layers 30B) alternately stacked therein is formed on the foundation layer 11. A pair of first channel body layers 20 extend from the upper surface 41u of the stacked body 41 through the stacked body 41 to the lower surface 41d of the stacked body 41. Between the foundation layer 11 and the stacked body 41, a linking portion 21 linking the lower ends of the pair of first channel body layers 20 is provided.

Between the pair of first channel body layers 20, an insulating layer 53 extending from the upper surface 41u of the stacked body 41 through the stacked body 41 to the lower surface 41d of the stacked body 41 is provided. On both sides of the pair of first channel body layers 20, another insulating layer 43 extending from the upper surface 41u of the stacked body 41 through the stacked body 41 to the lower surface 41d of the stacked body 41 is provided.

A memory film 30A is provided between each of the pair of first channel body layers 20 and each of the plurality of electrode layers 40. A silicide layer 40s is provided between the insulating layer 53 and each of the plurality of electrode layers 40.

In the nonvolatile semiconductor memory device 1, a pair of select gate electrodes 45 are provided on the stacked body 41. A second channel body layer 51 penetrates through each of the pair of select gate electrodes 45 and is connected to each of the pair of first channel body layers 20. Between each of the pair of select gate electrodes 45 and the second channel body layer 51, a gate insulating film 35, 36 is provided. Part of each of the pair of select gate electrodes 45 is silicidized. From the state shown in FIG. 8, bit lines and source lines are formed. Thus, the nonvolatile semiconductor memory device 1 illustrated in FIG. 1 is formed.

FIGS. 9A to 12B are schematic sectional views describing a method for manufacturing a nonvolatile semiconductor memory device according to a reference example.

Figure 9A:
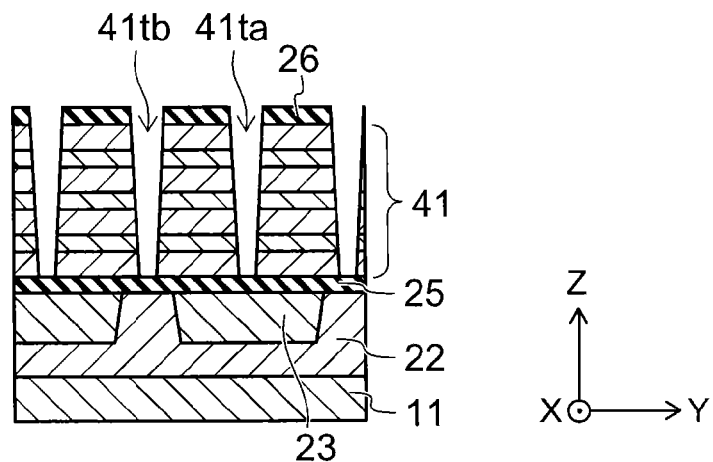
FIGS. 9A to 9C are schematic sectional views describing a method for manufacturing a nonvolatile semiconductor memory device according to a reference example.

First, the aforementioned stacked body 41 is formed on a foundation layer 11. Then, as shown in FIG. 9A, a trench 41ta and a trench 41tb are simultaneously formed.

Figure 9B:
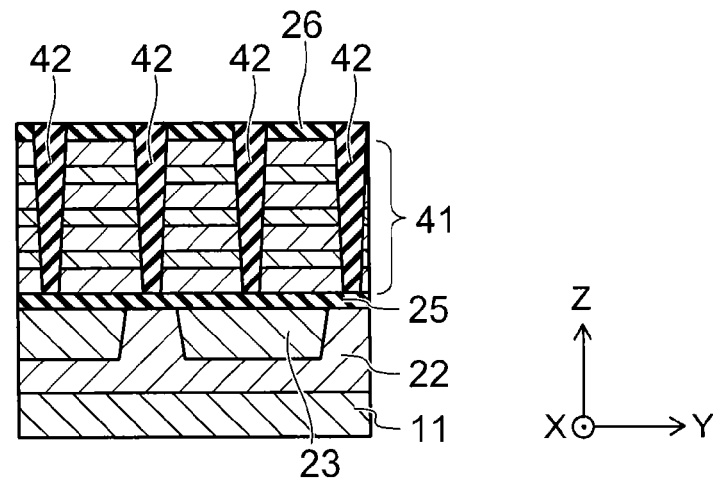

Next, as shown in FIG. 9B, an insulating layer 42 is formed in the trench 41ta, and an insulating layer 42 is formed in the trench 41tb. The insulating layer 42 includes silicon nitride. That is, at this stage, the stacked body is divided in the Y direction by the insulating layers 42 of the same material.

Figure 9C:
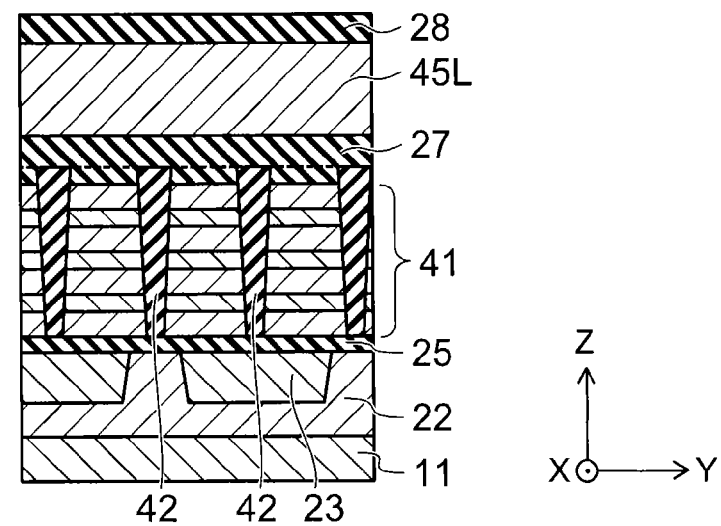

Next, as shown in FIG. 9C, an insulating layer 27, a select gate electrode layer 45L, and an insulating layer 28 are formed in this order on the stacked body 41 and on the insulating layer 42.

Figure 10A:
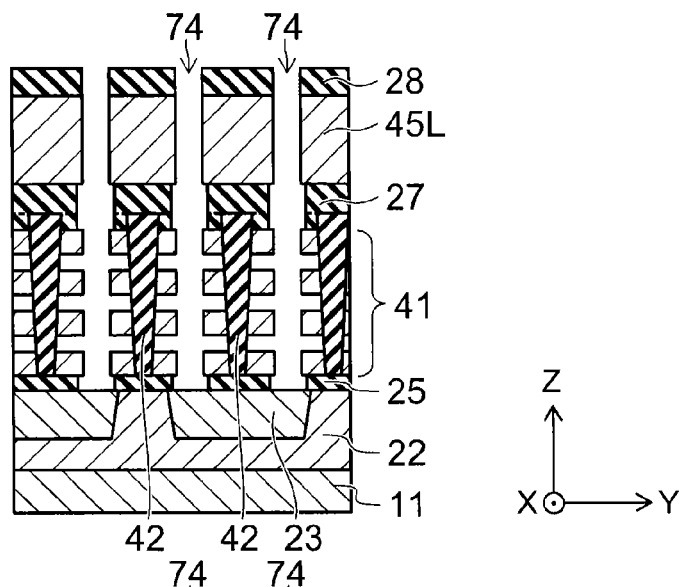
FIGS. 10A to 10C are schematic sectional views describing the method for manufacturing the nonvolatile semiconductor memory device according to the reference example.

Next, as shown in FIG. 10A, a pair of holes 74 extending from the upper surface 28u of the insulating layer 28 to the sacrificial layer 23 are formed. Each of the pair of holes 74 extends on both sides of the insulating layer 42.

Figure 10B:
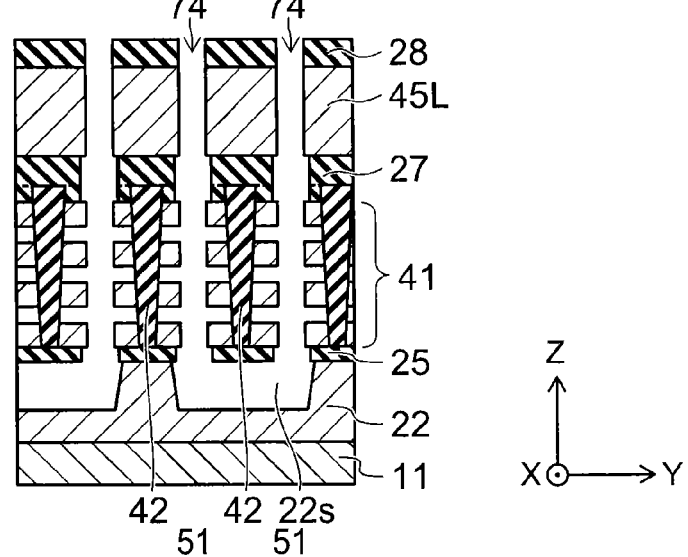

Next, as shown in FIG. 10B, the sacrificial layer 23 is removed through the pair of holes 74. Thus, a space portion 22s is formed in the semiconductor layer 22. Furthermore, the plurality of sacrificial layers 37 are removed through the pair of holes 74. Thus, a space is formed between the plurality of electrode layers 40.

Figure 10C:
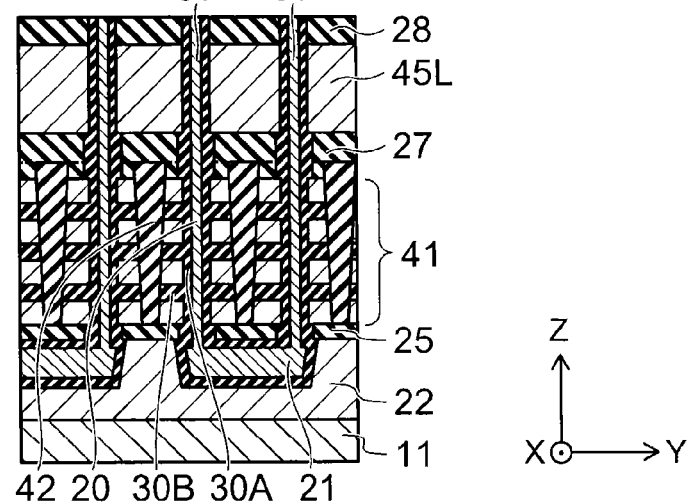

Next, as shown in FIG. 10C, a layer including a charge accumulation film 32 (the aforementioned memory film 30A) is formed on the sidewall of each of the pair of holes 74 and the inner wall of the space portion 22s. Sequentially, a channel body layer (channel body layer 20 and channel body layer 51) are formed on the sidewall of each of the pair of holes 74 and the inner wall of the space portion 22s. The layer including the charge accumulation film 32 is formed also between the plurality of electrode layers 40. The layer formed between the plurality of electrode layers 40 is the aforementioned insulating layer 30B.

Figure 11A:
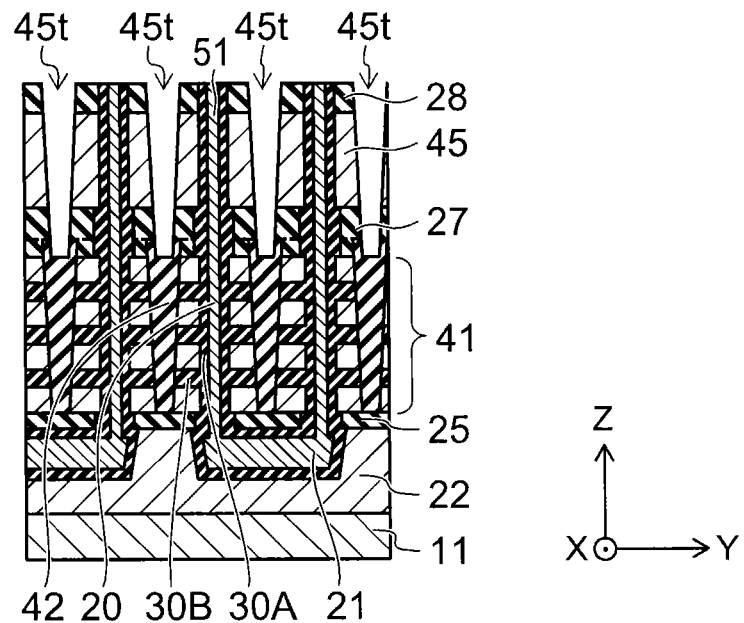
FIGS. 11A and 11B are schematic sectional views describing the method for manufacturing the nonvolatile semiconductor memory device according to the reference example.

Next, as shown in FIG. 11A, a trench 45t extending from the upper surface of the insulating layer 28 through the select gate electrode layer 45L to the insulating layer 42 is formed. At this stage, the select gate electrode layer 45L is divided by the trench 45t into select gate electrodes 45. Then, the insulating layer 42 is removed through the trench 45t. For instance, the insulating layer 42 including silicon nitride is dissolved with hot phosphoric acid. Thus, the insulating layer 42 is removed. This state is shown in FIG. 11B.

Figure 11B:
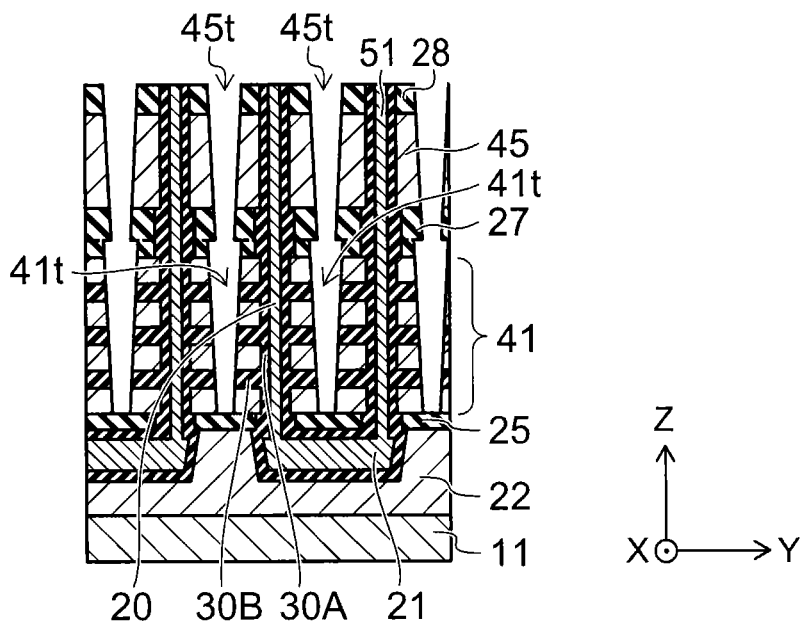

As shown in FIG. 11B, by the removal of the insulating layer 42, a trench 41t linked to the trench 45t is formed below the trench 45t.

Figure 12A:
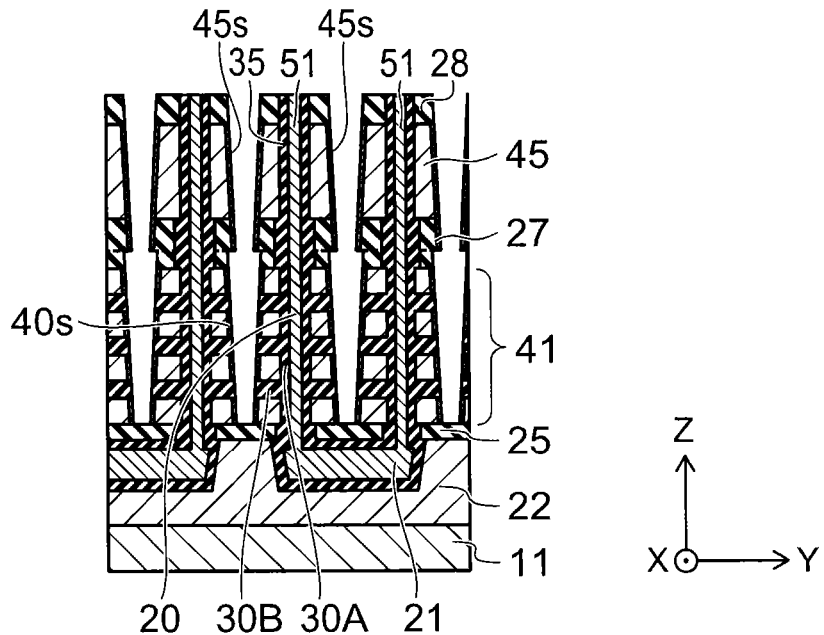
FIGS. 12A to 12B are schematic sectional views describing the method for manufacturing the nonvolatile semiconductor memory device according to the reference example.

Next, as shown in FIG. 12A, a silicide layer 40s is formed on the side surface of each of the plurality of electrode layers 40 divided by the trench 41t. Furthermore, a silicide layer 45s is formed on the side surface of the select gate electrode 45.

Figure 12B:
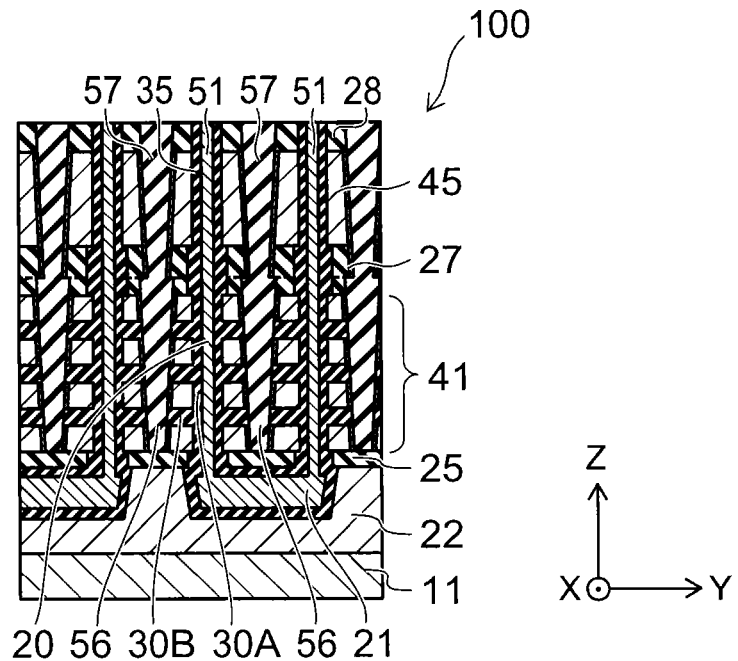

Next, as shown in FIG. 12B, an insulating layer 56 is formed in the trench 41t, and an insulating layer 57 is formed in the trench 45t. Thus, the nonvolatile semiconductor memory device 100 is formed.

In the reference example, at the stage shown in FIG. 9A, a stacked body 41 having a high aspect ratio is formed (e.g., aspect ratio≥10). This is because the trench 41ta and the trench 41tb are simultaneously formed. Furthermore, at the stage shown in FIG. 11B, a stacked body including the select gate electrode layer 45L is further formed on the stacked body 41. Thus, the aspect ratio of the stacked body, which includes the stacked body 41 and the stacked body including the select gate electrode layer 45L, is made even higher than the aspect ratio of the stacked body 41. In the reference example, the arrangement pitch of the trenches dividing the stacked body 41 and the select gate electrode layer 45L is approximately half that of this embodiment. Furthermore, the aspect ratio becomes higher as the design is downsized and the number of electrode layers 40 is increased to increase the memory capacity.

Processing on the stacked body having such a high aspect ratio may cause the stacked body 41 and the select gate electrode layer 45L to collapse during the process.

For instance, after forming the trench 41t or the trench 45t, there are wet processing steps such as a wet processing step for removing residues remaining in the trench and a wet processing step as preprocessing for embedding an insulating layer in the trench. Furthermore, in the process of transitioning from FIG. 11A to FIG. 11B, the inside of the trenches 41t, 45t is exposed to hot phosphoric acid solution.

In such a wet processing step, the adjacent stacked bodies may be brought into contact with each other, or the stacked body may collapse, due to the surface tension of water. The contact between the adjacent stacked bodies and the collapse of the stacked body are made more likely to occur with the increase of the aspect ratio of the stacked body.

In contrast, in this embodiment, the trench 41ta and the trench 41tb are formed not simultaneously. In this embodiment, at the stage shown in FIG. 4B, the trench 41ta is formed, and an insulating layer 42 is embedded in the trench 41ta. Then, at the stage shown in FIG. 5A, the trench 41tb is formed.

That is, if the trench 41ta and the trench 41tb are collectively referred to as trenches 41t, then in this embodiment, the trenches 41t are formed in two steps. Thus, the arrangement pitch of the trenches 41t is approximately twice that of the reference example. As a result, the aspect ratio of the stacked body 41 divided by the trenches 41t is made lower than that of the reference example.

Furthermore, in this embodiment, the material of the insulating layer 42 formed in the trench 41ta and the material of the insulating layer 43 formed in the trench 41tb are different. Thus, in the process of transitioning from FIG. 7A to FIG. 7B, one of the insulating layer 42 and the insulating layer 43 can be selectively etched. For instance, this embodiment performs a process of removing the insulating layer 42 while leaving the insulating layer 43.

Thus, the stacked body 41 and the stacked body including the select gate electrode layer 45L are made less likely to collapse with the insulating layer 43 serving as a strut. In the reference example, the insulating layer 43 functioning as a strut does not exist. Thus, the stacked body 41 and the stacked body including the select gate electrode layer 45L may collapse.

Furthermore, in this embodiment, because collapse of the stacked body is suppressed, the number of electrode layers 40 can be increased, and the design can be downsized. This further increases the degree of integration of memory cells.

The embodiments have been described above with reference to examples. However, the embodiments are not limited to these examples. More specifically, these examples can be appropriately modified in design by those skilled in the art. Such modifications are also encompassed within the scope of the embodiments as long as they include the features of the embodiments.

The components included in the above examples and the layout, material, condition, shape, size and the like thereof are not limited to those illustrated, but can be appropriately modified. For instance, FIGS. 6A and 6B show the manufacturing process of removing the sacrificial layers 37. However, the embodiments also include a manufacturing process of providing an insulating film of e.g. silicon oxide instead of the sacrificial layers 37, and not removing the sacrificial layers 37 at the stage of FIG. 6B. In this case, the stacked body 41 includes electrode layers 40 and an insulating layer sandwiched between the electrode layers 40.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A method for manufacturing a nonvolatile semiconductor memory device including a memory string having series-connected memory cells, the method comprising:
    forming a first semiconductor layer on a foundation layer;
    forming a first sacrificial layer having a bottom surface and a side surface, and the bottom surface and the side surface being surrounded with the first semiconductor layer;
    forming a first insulating layer on the first semiconductor layer and on the first sacrificial layer;
    forming a stacked body on the first insulating layer, the stacked body including a plurality of electrode layers and a plurality of second sacrificial layers alternately stacked;
    forming a first trench extending from an upper surface of the stacked body to the first insulating layer on the first sacrificial layer;
    forming a second insulating layer in the first trench;
    forming a second trench extending from the upper surface of the stacked body to the first insulating layer; and
    forming a third insulating layer in the second trench.

2. The method according to claim 1, further comprising, after the forming a third insulating layer:
    forming a fourth insulating layer on the stacked body, the second insulating layer, and the third insulating layer;
    forming a select gate electrode layer on the fourth insulating layer;
    forming a fifth insulating layer on the select gate electrode layer;

forming a pair of holes extending from an upper surface of the fifth insulating layer to the first sacrificial layer, and each of the pair of holes extending on both sides of the second insulating layer;

forming a space portion linking lower ends of the pair of holes in the first semiconductor layer by removing the first sacrificial layer through the pair of holes;

forming a layer and a channel body layer in sequence on a sidewall of each of the pair of holes and an inner wall of the space portion, and the layer including a charge accumulation film;

forming a third trench and a fourth trench, the third trench extending from the upper surface of the fifth insulating layer through the select gate electrode layer to the second insulating layer, and the fourth trench extending from the upper surface of the fifth insulating layer through the select gate electrode layer to the third insulating layer; and forming the first trench linked to the third trench below the third trench by removing the second insulating layer through the third trench.

3. The method according to claim 2, further comprising, after the forming the first trench linked to the third trench:

silicidizing part of each of the plurality of electrode layers in the stacked body divided by the first trench, and silicidizing part of the select gate electrode layer divided by the third trench and the fourth trench; and forming a sixth insulating layer in the first trench, forming a seventh insulating layer in the third trench, and forming an eighth insulating layer in the fourth trench.

4. The method according to claim 2, wherein the plurality of second sacrificial layers are removed in conjunction with removing the first sacrificial layer through the pair of holes.

5. The method according to claim 4, wherein after removing the plurality of second sacrificial layers, the layer including the charge accumulation film is formed between the electrode layers.

6. The method according to claim 2, wherein the first trench divides the stacked body in an arranging direction of the pair of holes.

7. The method according to claim 6, wherein the second trench further divides the stacked body in the arranging direction of the pair of holes.

8. The method according to claim 2, wherein the third trench divides the select gate electrode layer in an arranging direction of the pair of holes.

9. The method according to claim 8, wherein the fourth trench further divides the select gate electrode layer in the arranging direction of the pair of holes.

10. The method according to claim 2, wherein the second insulating layer is removed through the third trench by wet etching.

11. The method according to claim 1, wherein the second insulating layer and the third insulating layer are different in material.

12. The method according to claim 11, wherein the second insulating layer includes silicon nitride, and the third insulating layer includes silicon oxide.

13. A method for manufacturing a nonvolatile semiconductor memory device including a memory string having series-connected memory cells, the method comprising:

forming a first semiconductor layer on a foundation layer;

forming a first sacrificial layer having a bottom surface and a side surface, and the bottom surface and the side surface being surrounded with the first semiconductor layer;

forming a first insulating layer on the first semiconductor layer and on the first sacrificial layer;

forming a stacked body on the first insulating layer, the stacked body including a plurality of electrode layers;

forming a first trench extending from an upper surface of the stacked body to the first insulating layer on the first sacrificial layer;

forming a second insulating layer in the first trench;

forming a second trench extending from the upper surface of the stacked body to the first insulating layer; and forming a third insulating layer in the second trench.

14. The method according to claim 13, further comprising, after the forming a third insulating layer:

forming a fourth insulating layer on the stacked body, the second insulating layer, and the third insulating layer;

forming a select gate electrode layer on the fourth insulating layer;

forming a fifth insulating layer on the select gate electrode layer;

forming a pair of holes extending from an upper surface of the fifth insulating layer to the first sacrificial layer, and each of the pair of holes extending on both sides of the second insulating layer;

forming a space portion linking lower ends of the pair of holes in the first semiconductor layer by removing the first sacrificial layer through the pair of holes;

forming a layer and a channel body layer in sequence on a sidewall of each of the pair of holes and an inner wall of the space portion, the layer including a charge accumulation film;

forming a third trench and a fourth trench, the third trench extending from the upper surface of the fifth insulating layer through the select gate electrode layer to the second insulating layer, and the fourth trench extending from the upper surface of the fifth insulating layer through the select gate electrode layer to the third insulating layer; and forming the first trench linked to the third trench below the third trench by removing the second insulating layer through the third trench.

15. The method according to claim 14, further comprising, after the forming the first trench linked to the third trench:

silicidizing part of each of the plurality of electrode layers in the stacked body divided by the first trench, and silicidizing part of the select gate electrode layer divided by the third trench and the fourth trench; and forming a sixth insulating layer in the first trench, forming a seventh insulating layer in the third trench, and forming an eighth insulating layer in the fourth trench.

16. The method according to claim 13, wherein the second insulating layer and the third insulating layer are different in material.

17. The method according to claim 16, wherein the second insulating layer includes silicon nitride, and the third insulating layer includes silicon oxide.

18. A nonvolatile semiconductor memory device comprising:

a foundation layer;

a stacked body provided on the foundation layer and including a plurality of electrode layers and a plurality of intermediate layers alternately stacked;

a pair of first channel body layers extending from an upper surface of the stacked body through the stacked body to a lower surface of the stacked body;

an insulating layer provided between the pair of first channel body layers and extending from the upper surface of the stacked body through the stacked body to the lower surface of the stacked body;

another insulating layer provided on both sides of the pair of first channel body layers and extending from the upper surface of the stacked body through the stacked body to the lower surface of the stacked body, a material of the another insulating layer being different from a material of the insulating layer;

a layer including a charge accumulation film, and the layer being provided between each of the pair of first channel body layers and each of the plurality of electrode layers, the charge accumulation film surrounding each of the pair of first channel body layers;

a silicide layer provided between the insulating layer and each of the plurality of electrode layers;

a pair of select gate electrodes provided on the stacked body;

a second channel body layer penetrating through each of the pair of select gate electrodes and connected to each of the pair of first channel body layers; and a gate insulating film provided between each of the pair of select gate electrodes and the second channel body layer.

19. The device according to claim 18, wherein part of each of the pair of select gate electrodes is silicidized.

20. The device according to claim 18, further comprising:

a linking portion linking lower ends of the pair of first channel body layers between the foundation layer and the stacked body.

* * * * *